United States Patent [19]

Hirai et al.

[11] 4,312,923
[45] Jan. 26, 1982

[54] SUPER HARD-HIGHLY PURE SILICON NITRIDES, AND A PROCESS AND APPARATUS FOR PRODUCING THE SAME

[75] Inventors: Toshio Hirai; Koichi Nihara, both of Sendai, Japan

[73] Assignee: The Research Institute for Iron, Steel and Other Metals of the Tohoku University, Sendai, Japan

[21] Appl. No.: 120,090

[22] Filed: Feb. 11, 1980

Related U.S. Application Data

[60] Continuation of Ser. No. 926,622, Jul. 21, 1978, abandoned, which is a division of Ser. No. 756,282, Jan. 3, 1977, Pat. No. 4,118,539.

[30] Foreign Application Priority Data

Jan. 13, 1976 [JP] Japan ............................ 51-2468

[51] Int. Cl.$^3$ ............................................. C30B 29/00
[52] U.S. Cl. ............................ 428/446; 156/DIG. 99; 156/613
[58] Field of Search ....... 156/611, 613, 614, DIG. 99, 156/612, DIG. 64; 428/446, 538, 36; 427/94; 423/344; 422/245; 252/62.3 R, 62.3 C, 62.3 E

[56] References Cited

U.S. PATENT DOCUMENTS

3,226,194  12/1965  Kuntz .................. 156/DIG. 99
3,394,991  7/1968  Evan .................... 156/614

OTHER PUBLICATIONS

Whitner, Western Electric Co., Tech. DIG. #11, Jul. 1968, pp. 5-6.
Grieco J. of Electrochem. Soc. Solid State, Jan. 1968, vol. 115 #5, pp. 521-531.

Primary Examiner—Hiram Bernstein
Attorney, Agent, or Firm—Stevens, Davis, Miller & Mosher

[57] ABSTRACT

A super hard-highly pure silicon nitride includes a preferentially oriented crystalline silicon nitride having a grain size of 1-50 μm and a micro Vickers hardness of 3,000 kg/mm$^2$ under a load of 100 g, a finely grained crystalline silicon nitride having an average grain size of less than 1 μm and a micro Vickers hardness of 3,500 kg/mm$^2$ under a load of 100 g, and an amorphous silicon nitride having a micro Vickers hardness of 2,200 kg/mm$^2$ under a load of 100 g, and is produced by blowing a nitrogen depositing source and a silicon depositing source on a substrate heated at 500°-1,900° C. with a blowpipe composed of a pipe assembly wherein a first pipe for the nitrogen depositing source is surrounded with a second pipe for the silicon depositing source and the distance from an opening end of the first pipe to the substrate is shorter than the distance from an opening end of the second pipe to the substrate.

4 Claims, 11 Drawing Figures

0.01 mm 0.05 mm 0.05 mm

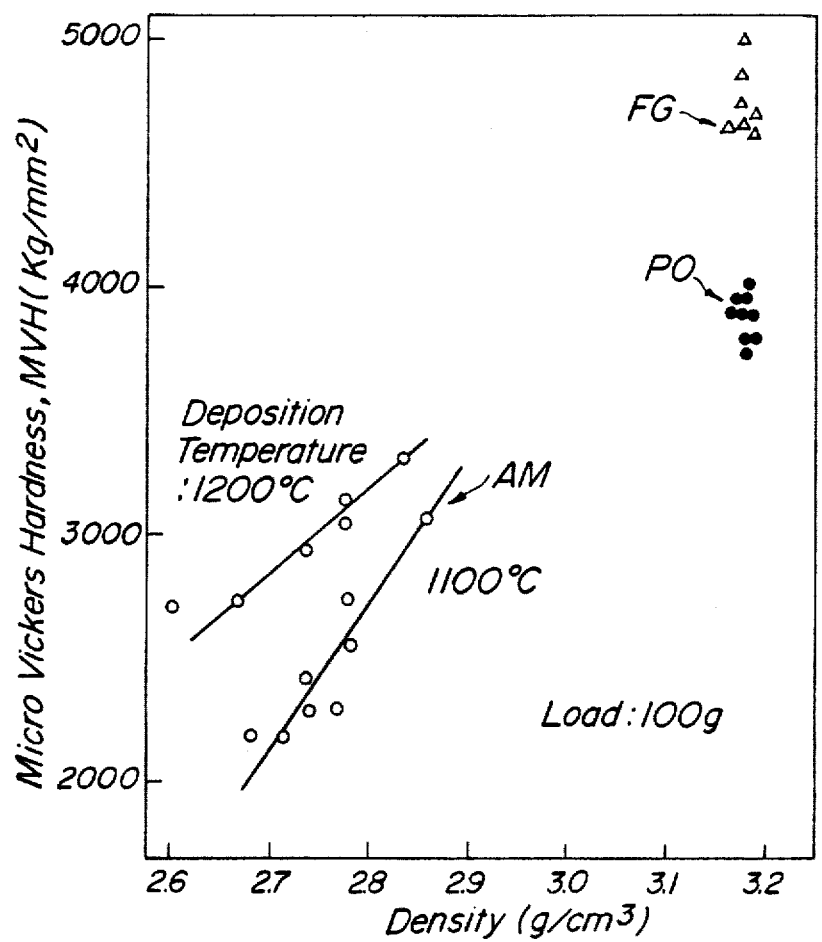

FIG.8A  FIG.8B  FIG.8C
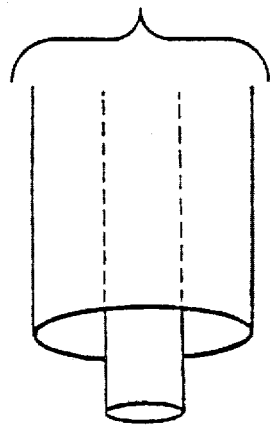
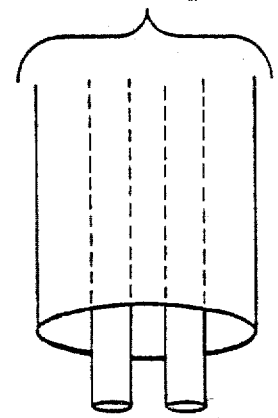
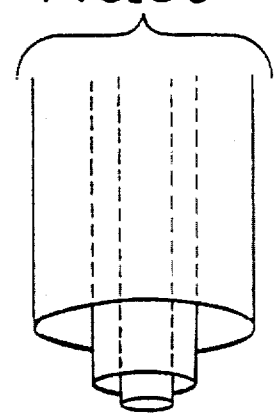
FIG.9
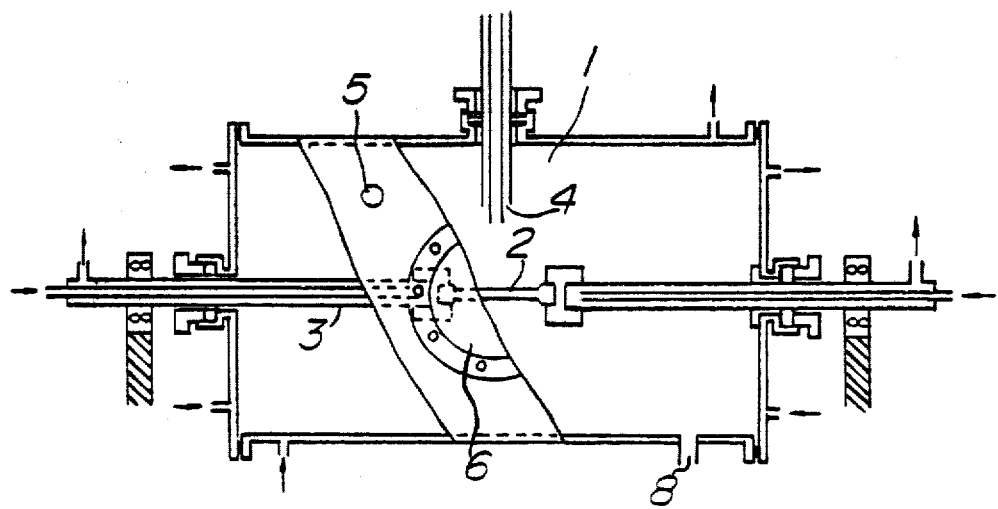

SUPER HARD-HIGHLY PURE SILICON NITRIDES, AND A PROCESS AND APPARATUS FOR PRODUCING THE SAME

This is a continuation of application Ser. No. 926,622 filed July 21, 1978 now abandoned which in turn is a divisional of Ser. No. 756,282 filed Jan. 3, 1977, issued as U.S. Pat. No. 4,118,539 on Oct. 3, 1978.

BACKGROUND OF THE INVENTION

1. Field of the Invention

The present invention relates to super hard-highly pure silicon nitrides ($Si_3N_4$) and a process and apparatus for producing the same by chemical vapor-deposition. The super hard-highly pure silicon nitrides of the present invention include a preferentially oriented crystalline $Si_3N_4$ having a grain size of 1 to 50 $\mu m$ and a micro Vickers hardness (hereinafter abbreviated as MVH) of more than 3,000 $kg/mm^2$ under a load of 100 g in which a particular crystal face is oriented in a particular direction, a finely grained crystalline $Si_3N_4$ having an average grain size of less than 1 $\mu m$ and an MVH of more than 3,500 $kg/mm^2$ under the same load in which a primary cone is composed of these fine grains, and an amorphous $Si_3N_4$ having an MVH of more than 2,200 $kg/mm^2$ under the same load.

2. Description of the Prior Art

Heretofore, it has been known to produce silicon nitrides by a chemical vapor-deposition method. For instance, U.S. Pat. No. 3,226,194 discloses that a mixture of $SiN_4$ and $NH_3$ is chemically deposited on a substrate such as graphite, $Al_2O_3$, hot-pressed boron nitride and chemical vapor-deposited boron nitride at a temperature of 1,200°–1,900° C. under a gas pressure of less than 300 mmHg to form a crystalline or amorphous silicon nitride having a thickness of less than about 1 mm and that the resulting crystalline $Si_3N_4$ has an MVH of 2,850 $kg/mm^2$ and is used in a high-temperature window, an insulator for fuel cell, a tooling material and an abrasive material.

In U.S. Pat. No. 3,637,423, there is disclosed that a silicon halide ($SiX_4$) is reacted with ammonia ($NH_3$) at a low temperature to form an intermediate compound $SiX_4.2NH_3$ and then the latter compound is evaporated at a temperature of 100°–125° C. under vacuum and chemically deposited on a graphite or a high-melting metal heated at a temperature of 850°–1,385° C., while being carried with $N_2$ gas; to form a silicon nitride film and that the materials coated with this silicon nitride film have good high-temperature oxidation resistance and insulating property.

In Japanese Patent Application laid open No. 133,199/75, there is disclosed that a mixture of $NH_3$ and a silicon compound is preheated at 100°–400° C. and then chemically deposited on a substrate heated above 400° C. to form a high density $Si_3N_4$ film, which is useful in the semiconductor industry.

In a an article of the title "Pyrolytic Silicon Nitride Coatings", *Special Ceramics*, Vol. 6, 1973, pp. 305–320, a crystalline or amorphous silicon nitride film having a thickness of 0.8 mm at maximum is produced by reacting $SiH_4$ or $SiCl_4$ with $NH_3$ at a temperature of 800°–1,380° C. and chemically depositing the resulting reaction product on a substrate such as graphite, silicon nitride shaped body or Si with Ar, $N_2$ or $H_2$ as a carrier gas under a gas pressure of 1 atm. In this literature, there is disclosed that the substrate coated with this $Si_3N_4$ film is excellent in the abrasion resistance, corrosion resistance and high-temperature oxidation resistance, but microcracks are always caused in the amorphous $Si_3N_4$ having a thickness of more than 1 $\mu m$.

Furthermore, in an article of the title "Some Properties of Vapor Deposited Silicon Nitride Films Using the $SiH_4$-$NH_3$-$H_2$ System", *Journal of the Electrochemcial Society*, Vol. 114, No. 7, 1967, pp 733–737, an amorphous $Si_3N_4$ thin film having a thickness of about 9 $\mu m$ or a whisker-like crystalline $Si_3N_4$ is produced by reacting a mixed gas of $SiH_4$, $NH_3$ and $H_2$ as a starting material at a temperature of 600°–1,400° C. and chemically depositing the resulting reaction product on a heated Si substrate. In this literature, there is disclosed that the amorphous $Si_3N_4$ thin film has a Young's modulus of $6.7 \times 10^3$ $kg/mm^2$ and a Knoop hardness of about 4,000 $kg/mm^2$ under a load of 8 g. This hardness value corresponds to an MVH of about 2,000 $kg/mm^2$ under a load of 100 g.

As can be seen from these publications, the micro Vickers hardness of the known chemical vapor-deposited $Si_3N_4$ under a load of 100 g is about 2,000 $kg/mm^2$ at maximum in case of the amorphous body and about 2,850 $kg/mm^2$ at maximum in case of the crystalline body. However, it is recently desired to develop silicon nitrides having a hardness considerably higher than the above mentioned values. Furthermore, in the well known chemical vapor-deposition of silicon nitrides, the deposition rate is as slow as 0.4 mm/hr at most and hence is impractical. Moreover, silicon nitride having an MVH of about 3,500 $kg/mm^2$ under a load of 100 g has been produced by the conventional hot pressing method. However, this silicon nitride is obtained only in a block form and is a mixture of $\alpha$-$Si_3N_4$ and $\beta$-$Si_3N_4$ and further contains more than 1% of MgO and so on as an impurity. Therefore, this product has a disadvantage that the hardness and mechanical properties at an elevated temperature are considerably deteriorated.

SUMMARY OF THE INVENTION

It is, therefore, an object of the present invention to solve the above drawbacks of the conventionally known silicon nitrides and to provide silicon nitrides having high purity, high density, less microcracking, super high hardness at room and elevated temperatures and high mechanical strength, and a process and apparatus for producing the same.

According to the present invention, there are provided super hard-highly pure silicon nitrides composed of any one of a crystalline and super hard-highly pure silicon nitride (hereinafter referred to as preferentially oriented crystalline silicon nitride) having mainly a chemical composition of $Si_3N_4$ and an $\alpha$-type hexagonal structure wherein one or more of crystal faces (h k O), (h O l) and (h k l) are oriented in parallel to the deposition surface, a finely grained crystalline and super hard-highly pure silicon nitride (hereinafter referred to as finely grained crystalline silicon nitride) having mainly a chemical composition of $Si_3N_4$ and an $\alpha$-type hexagonal structure, and an amorphous and super hard-highly pure silicon nitride (hereinafter referred to as amorphous silicon nitride) having mainly a chemical composition of $Si_3N_4$. Further, the present invention provides a process and apparatus for producing the above mentioned silicon nitrides on a heated substrate by chemical vapor-deposition.

BRIEF DESCRIPTION OF THE DRAWINGS

The invention will now be described in greater detail with reference to the accompanying drawings, wherein:

FIG. 7 is a graph showing a relation between the hardness and the density of the silicon nitrides according to the invention;

FIGS. 8A–8C are perspective views of embodiments of the blowpipe composed of a pipe assembly and used for the production of silicon nitrides, respectively;

FIG. 9 is a partially broken cross sectional view of an embodiment of the apparatus for producing the silicon nitrides according to the invention;

DETAILED DESCRIPTION OF THE INVENTION

Figure 1A:
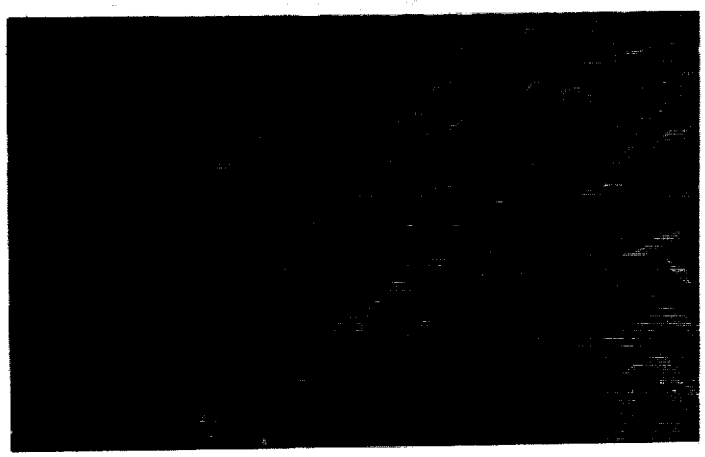
FIGS. 1A–1C are scanning electron microscope photographs showing surfaces of the preferentially oriented crystalline, finely grained crystalline and amorphous silicon nitrides according to the invention, respectively.
Figure 2A:
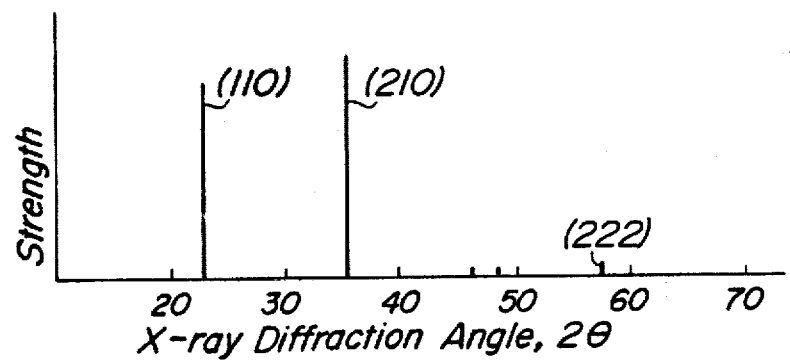
FIGS. 2A–2C are X-ray diffraction patterns showing as-deposited surfaces of the preferentially oriented crystalline and amorphous silicon nitrides according to the invention and the shaped article or powder of the conventional known sintered silicon nitride, respectively.
Figure 2B:
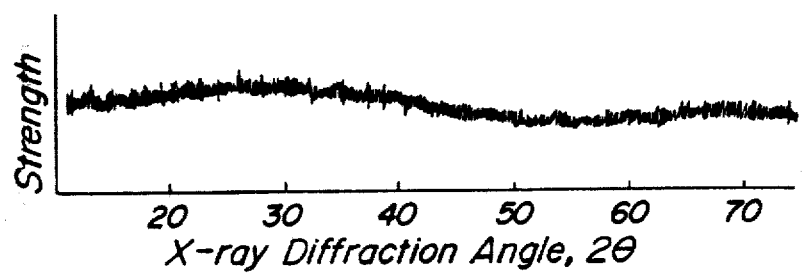
Figure 2C:
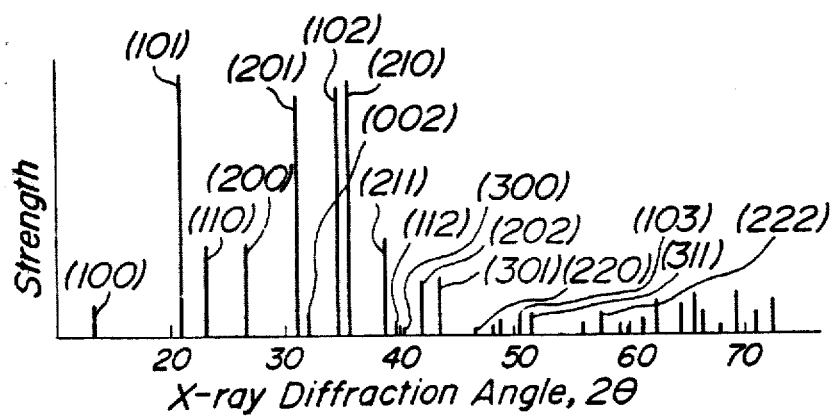

According to the present invention, the preferentially oriented crystalline silicon nitride has an α-type hexagonal structure wherein one or more of crystal faces (h k 0), (h 0 l) and (h k l) are oriented in parallel to the deposition surface as shown in the scanning electron microscope photograph of FIG. 1A. Furthermore, the grain size is also found to be 1–50 μm. As shown in the X-ray diffraction pattern of FIG. 2A, the crystal faces (110) and (210) are well oriented in the preferentially oriented crystalline silicon nitride according to the present invention, while the shaped article of the conventional sintered silicon nitride does not exhibit an orientation as shown in FIG. 2C. From this fact, it can be seen that only the preferentially oriented crystalline silicon nitride according to the present invention has particular orientations.

Figure 1B:

The finely grained crystalline silicon nitride according to the present invention has an α-type hexagonal structure wherein a primary cone is composed of fine grains having an average grain size of less than 1 μm as shown in the scanning electron microscope photograph of FIG. 1B.

Figure 1C:
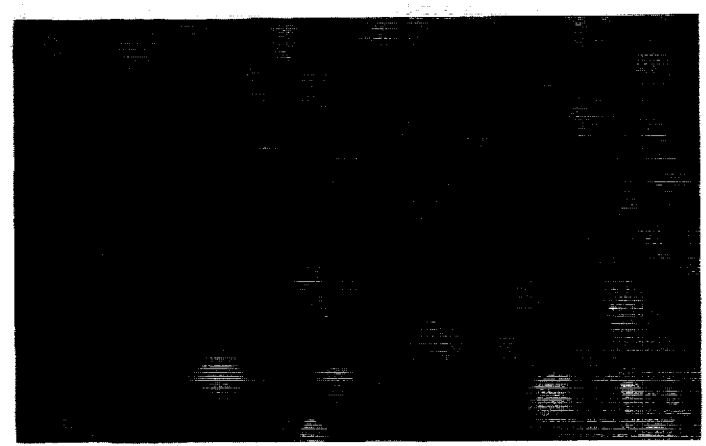

In the amorphous silicon nitride according to the present invention, a diameter of primary cone is less than 50 μm as shown in the scanning electron microscope photograph of FIG. 1C. Furthermore, the amorphous silicon nitride has two halos at angles of 20°–30° and 60°–70° as seen from the X-ray diffraction pattern of FIG. 2B, so that the inter-atomic distance of the amorphous silicon nitride is seemed to be substantially close to the inter-atomic distance of the crystalline silicon nitrides.

Figure 3A:
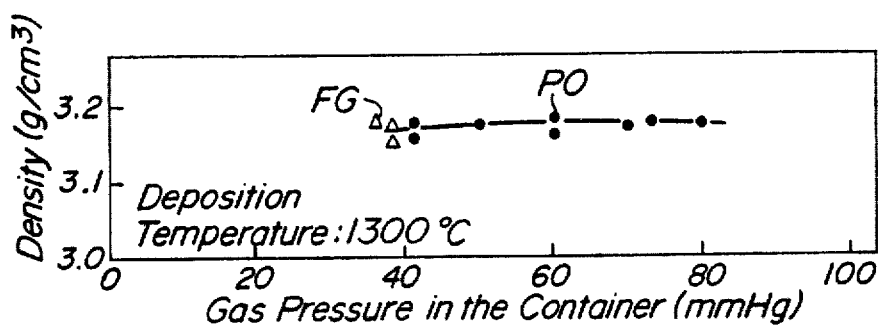
FIGS. 3A and 3B are graphs showing a relation between the gas pressure in the container during the deposition and the density of the preferentially oriented crystalline, finely grained crystalline and amorphous silicon nitrides according to the invention, respectively.
Figure 3B:
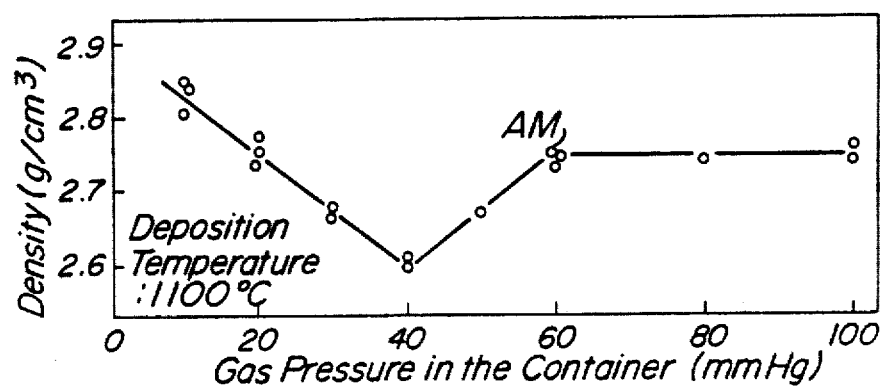

The density of the preferentially oriented (symbol PO) and finely grained (symbol FG) crystalline silicon nitrides according to the present invention is 3.184 g/cm$^3$ as shown in FIG. 3A. This value is the same as a theoretical density of silicon nitride having an α-type hexagonal structure. The amorphous silicon nitride (symbol AM) according to the present invention has a density of 2.85 g/cm$^3$ at maximum and 2.60 g/cm$^3$ at minimum as shown in FIG. 3B.

On the contrary, in the conventional sintered silicon nitride body, the density is only 70–80% of the theoretical density independently of the reaction sintering method or the hot pressing method. In order to obtain sintered bodies having 97–100% of the theoretical density, it is necessary that silicon nitride is added with 1–10 wt.% of MgO and so on as an impurity and hot-pressed at 1,600°–1,800° C. In the above mentioned U.S. Pat. No. 3,226,194, the silicon nitride having 97–100% of the theoretical density has been obtained by the chemical vapor-deposition of SiF$_4$ and NH$_3$, but the hardness of this silicon nitride is considerably lower than that of the present invention as will be mentioned below in detail.

According to the present invention, the preferentially oriented crystalline silicon nitride has a thermal expansion coefficient of $2.2 \times 10^{-6}$/°C. and endures 700–1,800 times or more against a heating-quenching cycle of from room temperature to 1,200° C. The finely grained crystalline silicon nitride has a thermal expansion coefficient of $2.7 \times 10^{-6}$/°C. and endures 700–2,000 times or more against the heating-quenching cycle. On the other hand, the conventional sintered Si$_3$N$_4$ endures about 600–1,500 times against the heating-quenching cycle, while the sintered SiC endures about 250 times against the heating-quenching cycle. From this fact, it can be seen that the crystalline silicon nitrides according to the present invention have a very excellent thermal shock resistance as compared with the conventional Si$_3$N$_4$ and SiC sintered bodies. Furthermore, the amorphous silicon nitride according to the present invention has a thermal expansion coefficient of $2.9 \times 10^{-6}$/°C.

Figure 4:
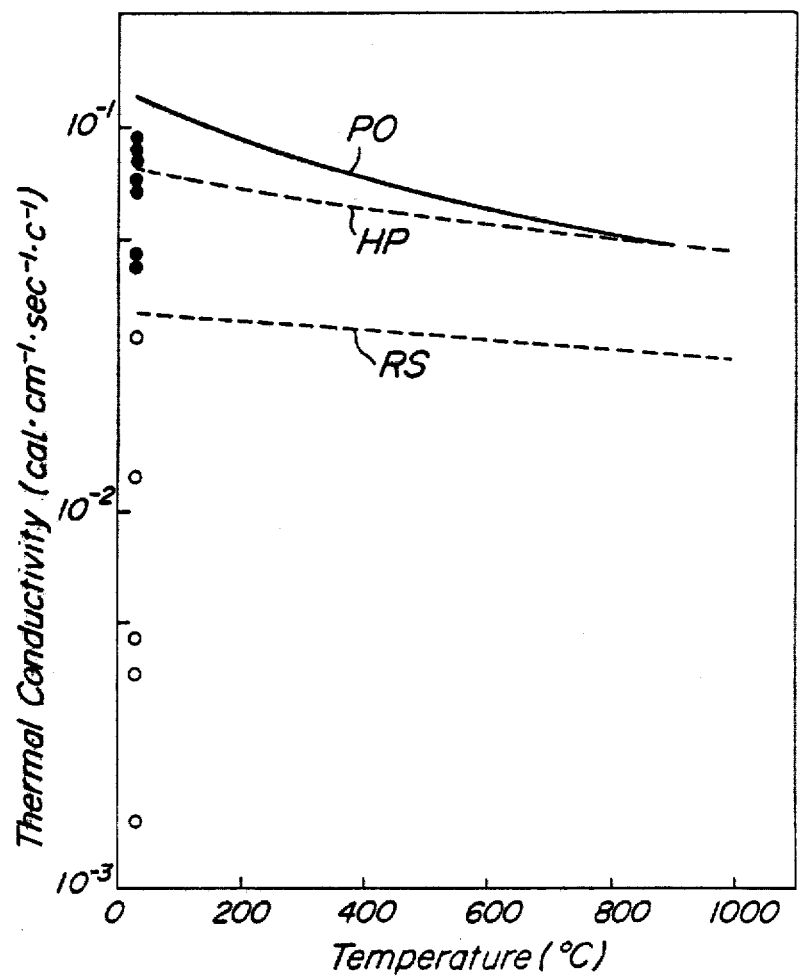
FIG. 4 is a graph showing a temperature dependence of thermal conductivity of the preferentially oriented crystalline silicon nitride according to the invention and the conventional known silicon nitrides obtained by reaction sintering method and hot pressing method.

Then, FIG. 4 shows the temperature dependence of thermal conductivity of the preferentially oriented crystalline silicon nitride according to the present invention. As seen from FIG. 4, the thermal conductivity (at room temperature) of the preferentially oriented crystalline silicon nitride (symbol PO) is about 4–100 times higher than that of the reaction sintered silicon nitride (symbol RS) of $1.5 \times 10^{-3} \sim 3 \times 10^{-2}$ cal/cm/sec/deg. and also about 1.3–4 times higher than that of the hot pressed silicon nitride (symbol HP) of $3.5 \times 10^{-2} \sim 9 \times 10^{-2}$ cal/cm/sec/deg. In general, it is known that the thermal shock resistance is increased with increase of the thermal conductivity and decrease of the thermal expansion coefficient. From this fact, it can be seen that the preferentially oriented crystalline silicon nitride has an excellent thermal shock resistance and is suitable for high-temperature structural materials.

In any one of the silicon nitrides according to the present invention, the weight change is less than 0.05 mg/cm$^2$ even after it is heated in air at 1,250° C. for 2 hours, while the weight change of the hot pressed silicon nitride is 0.1 mg/cm$^2$ and that of the reaction sintered silicon nitride is 5 g/cm$^2$, so that the oxidation resistance is very excellent in the silicon nitrides according to the present invention. Furthermore, these silicon nitrides according to the present invention have good resistance to corrosion against a molten metal such as Na, K, Li, Al, Fe and the like.

The preferentially oriented and finely grained crystalline silicon nitrides have very good electrical insulating properties because the electrical resistance of room temperature is $10^{14}$–$10^{15}$ Ω·cm and is 10–100 times larger than that of the reaction sintered silicon nitride. The amorphous silicon nitride has an electrical resistance at room temperature of $10^{12}$ Ω·cm, which is substantially equal to that of the conventional well-known chemical vapor deposited amorphous silicon nitride.

The invention will now be described in detail with respect to the hardness, which is one of most important features of the silicon nitrides according to the present invention.

Figure 5:
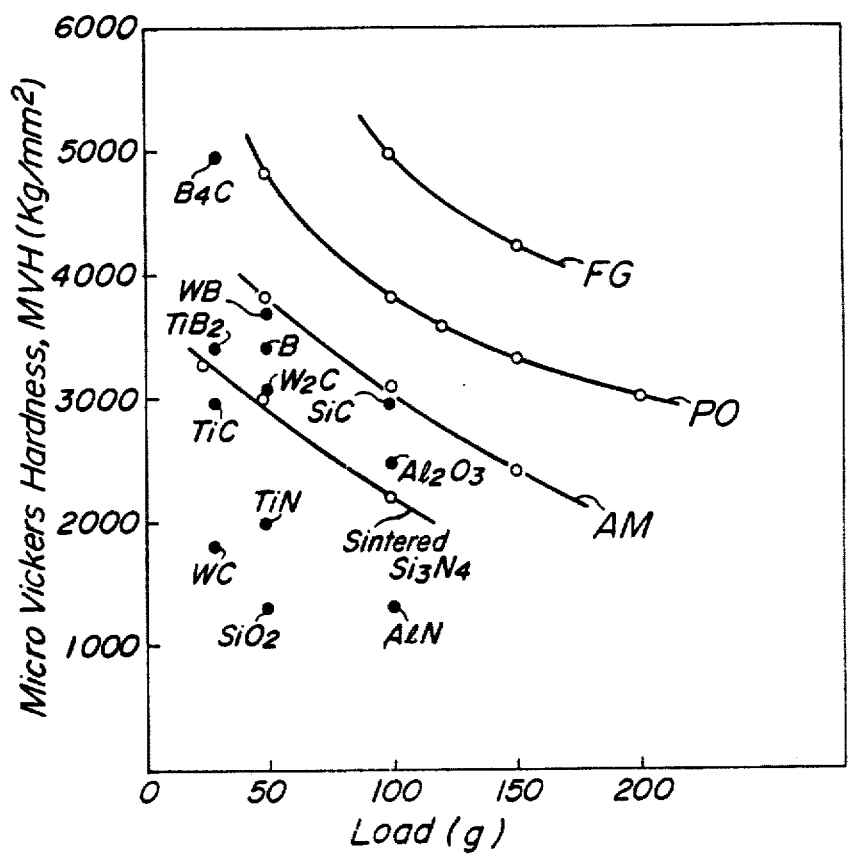
FIG. 5 is a graph showing a comparison in the hardness of the silicon nitrides according to the invention with the other known substances.

As shown by a curve PO in FIG. 5, the preferentially oriented crystalline silicon nitride according to the present invention has MVH of 4,800 kg/mm$^2$ under a load of 50 g, 3,800 kg/mm$^2$ under a load of 100 g and 3,100 kg/mm$^2$ under a load of 200 g and is fairly higher in the hardness than the crystalline silicon nitride produced from SiF$_4$ and NH$_3$ by the known chemical vapor-deposition having an MVH of 2,850 kg/mm$^2$ under a load of 100 g.

The reason why the preferentially oriented crystalline silicon nitride according to the present invention is very superior to the hardness to the known crystalline silicon nitride is considered to be due to the fact that the known silicon nitride has an α-type crystal structure oriented only in the crystal face (O O l), while the preferentially oriented crystalline silicon nitride according to the present invention has an α-type crystal structure oriented in one or more of the crystal faces (h k O), (h O l) and (h k l). Then, the hardness was measured with respect to each of the crystal faces in the α-type silicon nitride single crystal to obtain result as shown in the following Table 1.

TABLE 1

| Crystal face | Hardness in each crystal face of Si$_3$N$_4$ single crystal MVH under a load of 100g (kg/mm$^2$) |
|---|---|
| (o o l) | 2,758 |
| (h k o) | 3,627 |
| (h o l) | 3,577 |
| (h k l) | 3,528 |

As seen from Table 1, the hardness of crystal face (O O l) is lowest, while the hardness of each of crystal faces (h k O), (h O l) and (h k l) is fairly higher than that of crystal face (O O l) and ranges from 3,500 to 3,650 kg/mm$^2$.

The data of Table 1 show a measured value of the hardness with respect to each of the crystal faces in the α-type silicon nitride single crystal as mentioned above. However, the hardness of the preferentially oriented crystalline silicon nitride according to the present invention is higher than that of each of the crystal faces (h k O), (h O l) and (h k l) in the single crystal and reaches to 3,800 kg/mm$^2$ under a load of 100 g as shown by the curve PO in FIG. 5.

The finely grained crystalline silicon nitride according to the present invention has MVH of 4,000–5,000 kg/mm$^2$ under a load of 100 g and 3,500–4,300 kg/mm$^2$ under a load of 150 g as shown by a curve FG in FIG. 5. On the contrary, the crystalline silicon nitride produced by the conventional known hot pressing method has an MVH of about 3,500 kg/mm$^2$ under a load of 100 g and the crystalline silicon nitride produced by the conventional known chemical vapor-deposition method has an MVH of 2,850 kg/mm$^2$ under a load of 100 g. That is, the finely grained crystalline silicon nitride according to the present invention is considerably higher in hardness than the conventional known silicon nitrides and has a super high hardness next to diamond and cubic boron nitride.

As shown by a curve AM in FIG. 5, the amorphous silicon nitride according to the present invention has MVH of 3,800 kg/mm$^2$ under a load of 50 g, 3,100 kg/mm$^2$ under a load of 100 g and 2,500 kg/mm$^2$ under a load of 150 g and is fairly higher in the hardness than the conventional amorphous silicon nitride produced from a mixed gas of SiH$_4$, NH$_3$ and H$_2$ having an MVH of about 2,000 kg/mm$^2$ under a load of 100 g.

For comparison, the hardness of typical high hard materials are also shown in FIG. 5. For instance, the hardness (MVH) of the typical super hard material B$_4$C is 5,000 kg/mm$^2$ under a load of 30 g and about 3,200 kg/mm$^2$ (estimated value) under a load of 100 g and is lower than those of the crystalline silicon nitrides (curves PO, FG) according to the present invention. From this fact, it can be seen that the preferentially oriented and finely grained crystalline silicon nitrides are super hard materials.

Now, the cubic boron nitride having a hardness comparable with that of diamond is synthesized at 1,500°–2,000° C. under a pressure of about 50,000°–100,000 atm and has a particle size of about 0.5 mm at maximu. On the other hand, the silicon nitrides according to the present invention are inferior in the hardness to the cubic boron nitride, but can freely be produced in the form of block and film, so that they can be widely used for industrial applications.

The silicon nitrides according to the present invention will be described below with respect to the temperature dependence of hardness.

Figure 6:
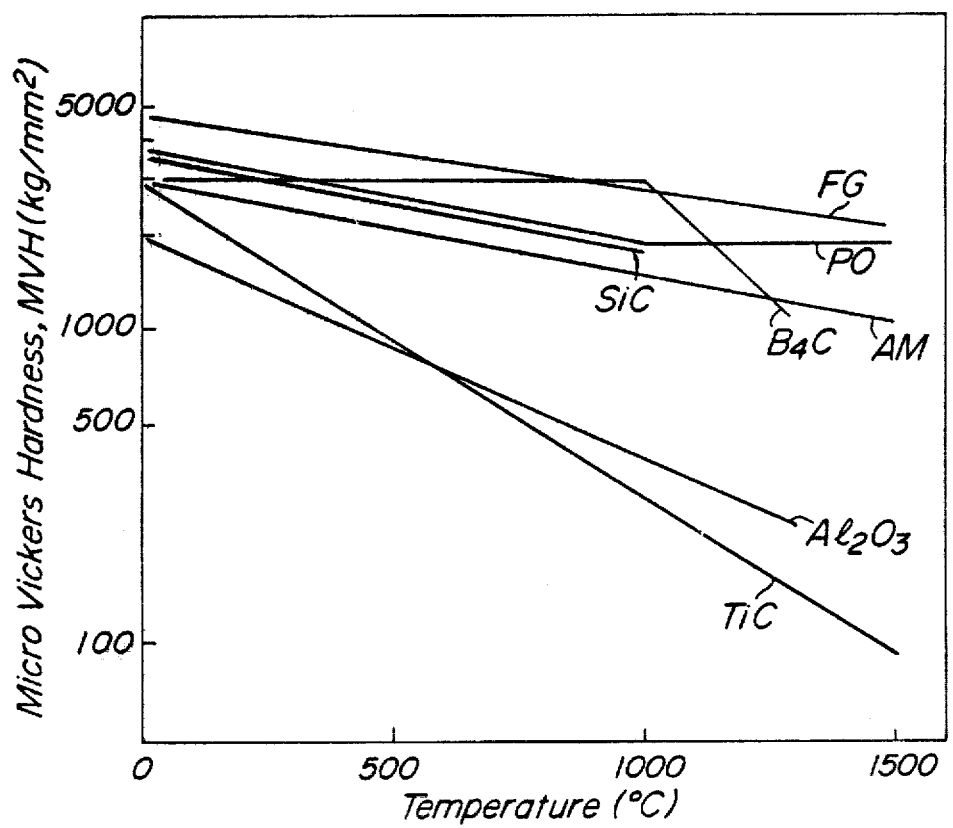
FIG. 6 is a graph showing a comparison in the hardness at elevated temperatures of the silicon nitrides according to the invention with the other known substances.

As shown by a straight line PO in FIG. 6, the temperature dependence of the hardness of the preferentially oriented crystalline silicon nitride is small and the super high hardness is still retained even at an elevated temperature of 1,500° C. because the MVH under a load of 100 g is 3,800 kg/mm$^2$ at room temperature and 2,000 kg/mm$^2$ at 1,500° C. In the finely grained crystalline silicon nitride, as shown by a straight line FG in FIG. 6, the MVH under a load of 100 g is 5,000 kg/mm$^2$ at room temperature and 2,200 kg/mm$^2$ at 1,500° C., so that the decrease of the hardness at an elevated temperature is small. Moreover, the hardness of the finely grained crystalline silicon nitride at 500° C. is fairly superior as the hardness at room temperature of the conventional hot pressed crystalline silicon nitride (MVH of 3,500 kg/mm$^2$ under a load of 100 g).

Furthermore, in the amorphous silicon nitride according to the present invention, the MVH under a load of 100 g is 3,000 kg/mm² at room temperature and 1,200 kg/mm² at 1,300° C. as shown by a straight line AM in FIG. 6, so that the decrease of the hardness is small even at an elevated temperature.

On the contrary, the hardness of common materials is considerably deteriorated at an elevated temperature and particularly the hardness of metals becomes very low at a temperature of from few hundreds to 1,000° C. In general, it is said that the hardness of ceramic materials does not so decrease at an elevated temperature as compared with that of the metal, but the hardness of TiC and $Al_2O_3$ decreases with increasing temperature as shown in FIG. 6. In TiC, for example, the hardness considerably decreases from 3,000 kg/mm² at room temperature up to 100 kg/mm² at 1,500° C. Further, it is said that the hardness of SiC is less in the temperature dependence and is actually measured up to 1,000° C., but the value rapidly decreases above 1,000° C. Furthermore, the hardness of the typical super hard material $B_4C$ is 3,000 kg/mm² at room temperature and does not change up to 1,000° C., but rapidly softens above 1,000° C.

As shown in FIG. 6, the preferentially oriented crystalline, finely grained crystalline and amorphous silicon nitrides according to the present invention are small in the decrease of the hardness at elevated temperature and have a super high hardness as compared with the conventional known super hard materials, so that they are most usable as industrial materials requiring a high hardness at elevated temperatures as mentioned below.

In the conventional sintered silicon nitride body, a high density is first attained by adding 1–10 wt.% of a sintering accelerator such as Si, MgO or the like prior to the reaction sintering or hot pressing. However, the presence of this accelerator causes the degradation of mechanical properties at an elevated temperature. On the contrary, in the production of the silicon nitrides according to the present invention, it is not necessary to add the sintering accelerator necessarily required for the conventional reaction sintering and hot pressing methods. Consequently, the silicon nitrides according to the present invention have a very high purity and are very excellent in the mechanical properties at room and elevated temperatures in association with the high density and high hardness at room and elevated temperatures as mentioned above.

The silicon nitrides according to the present invention will be described with respect to a relation between hardness and density.

The preferentially oriented crystalline silicon nitride has a density of 3.184 g/cm³ equal to a theoretical density and an MVH of 3,500–3,900 kg/mm² under a load of 100 g as shown by a symbol PO in FIG. 7. Further, the finely grained crystalline silicon nitride has a density of 3.184 g/cm³ equal to a theoretical density and an MVH of 4,000–5,000 kg/mm² under a load of 100 g as shown by a symbol FG in FIG. 7. Moreover, in the amorphous silicon nitride, the relation between the density and the hardness is linear as shown by a symbol AM in FIG. 7 and depends upon deposition temperatures. Therefore, the amorphous silicon nitride having optional density and hardness can be produced by properly selecting the deposition temperature.

The production of silicon nitrides according to the present invention will be described below.

According to the present invention, there is provided a process for producing super hard-highly pure silicon nitrides, characterized in that a gas of nitrogen depositing source and a gas of silicon depositing source are blown on a substrate heated at a temperature of 500°–1,900° C. by means of a blowpipe composed of a pipe assembly in which the gas stream of the nitrogen depositing source is surrounded with the gas stream of the silicon depositing source, and chemical vapor-deposition reaction of both the gases is caused on or near the substrate, whereby silicon nitride is deposited and formed on the substrate.

As the silicon depositing source, use may be made of at least one of the silicon halides (e.g., $SiCl_4$, $SiB_4$, $SiBr_4$, $SiI_4$, $Si_2Cl_6$, $Si_2Br_6$, $Si_2I_6$, $SiBrCl_3$, $SiICl_3$, $SiBr_3Cl$, $SiBr_2Cl_2$), silicon hydrides (e.g., $SiH_4$, $Si_2H_6$, $Si_3H_8$, $Si_4H_{10}$) and silicon hydrogen halides (e.g., $SiHCl_3$, $SiHBr_3$, $SiHF_3$, $SiHI_3$, $SiH_3Br$). Among them, $SiH_4$ and $SiCl_4$ are preferably used.

As the nitrogen depositing source, use may be made of at least one of the nitrogen hydrides (e.g., $HN_3$, $NH_3$, $N_2H_4$) and ammonium halides (e.g., $NH_4Cl$, $NH_4F$, $NH_4HF_2$, $NH_4I$). Among them, $NH_3$ and $N_2H_4$ are preferably used because they are relatively cheap and commercially available.

The formation of silicon nitride from the silicon depositing source and the nitrogen depositing source is mainly carried out according to the following reaction formulae (a), (b), (c) and (d);

(a) Use of silicon tetrachloride and ammonia as starting materials:

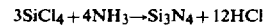

(b) Use of silicon tetrahydride and ammonia as starting materials:

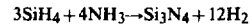

(c) Use of silicon tetrafluoride and ammonia as starting materials:

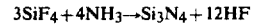

(d) Use of silicon tetrachloride and hydrazine as starting materials:

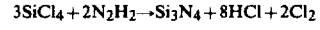

The temperature of the substrate causing the above reaction to form silicon nitride is within a range of 500 to 1,900° C., preferably 1,000 to 1,600° C.

In order to transfer one or two of the silicon depositing source and the nitrogen depositing source, at least one of $N_2$, Ar, He and $H_2$ can be used as a carrier gas, if necessary. Among them, $N_2$ may also act as the nitrogen depositing source, and $H_2$ may take part in the chemical vapor-deposition reaction of the silicon depositing source. In general, the carrier gas is used for an adjustment of total gas pressure in a container accommodating the substrate, an adjustment of a mixing vapor ratio of the silicon depositing source to the nitrogen depositing source and an adjustment of a pattern of gas streams in the container. However, silicon nitrides can also be formed without using the carrier gas.

Next, the production of silicon nitride will be described using $SiCl_4$ and $NH_3$ as starting materials and $H_2$ as a carrier gas.

Each of $SiCl_4$ and $NH_3$ is introduced into a container through a pipe assembly, in which $NH_3$ is fed into an inner pipe of the pipe assembly and $SiCl_4$ is fed into an outer pipe thereof. Then, both gases of $SiCl_4$ and $NH_3$ are blown on a substrate in the container while surrounding the gas stream of $NH_3$ with the gas stream of $SiCl_4$. In this case, the carrier gas $H_2$ is also blown through the outer pipe, so that it is advantageous to previously mix $H_2$ with $SiCl_4$.

Alternatively, three concentric pipes can be used as a pipe assembly. In this case, the gas of the nitrogen depositing source is passed through an inner pipe, the gas of the silicon depositing source or the gas of the silicon depositing source and the carrier gas is passed through an outer pipe, and the carrier gas is passed through an intermediate pipe, whereby the mixing of the nitrogen depositing source with the silicon depositing source is suppressed as far as possible before both the sources arrive at the substrate, that is, the chemical vapor-deposition reaction of both the sources is effectively suppressed prior to the arrival at the substrate. Consequently, the more homogeneous silicon nitride can be produced efficiently.

The amount and stream pattern of $SiCl_4$ vapor to be introduced into the container can be properly adjusted by the flow amount of $H_2$. Furthermore, $H_2$ is considered to promote the separation of Si from the silicon depositing source because it reacts with $SiCl_4$ on or near the substrate to form an intermediate compound such as $SiHCl_2$, $SiH_2Cl_2$, $SiH_3Cl$ and the like.

When using the container having, for example, a diameter of 300 mm and a length of 500 mm, the flow amount of $H_2$ is 50–3,000 cc/min, preferably 400–1,500 cc/min, more particularly 600–700 cc/min. The flow amount of $SiCl_4$ (liquid state) is 0.4–2 cc/min, preferably 0.6–1.5 cc/min. The flow amount of $NH_3$ is 20–2,000 cc/min, preferably 50–70 cc/min.

According to the present invention, the reason why it is necessary to blow $NH_3$ and $SiCl_4$ on the substrate while surrounding the stream of $NH_3$ with the stream of $SiCl_4$ and if necessary, $H_2$ is considered as follows:

Since $SiCl_4$ easily reacts with $NH_3$ even at room temperature to form intermediate compounds such as ammonium chloride ($NH_4Cl$), silicon diimide [$Si(NH)_2$] and the like, if it is intended to efficiently and homogeneously deposit $Si_3N_4$ on the substrate, it is necessary to cause the chemical vapor-deposition reaction on or near the substrate. For this reason, in the above mentioned *Special Ceramics*, there is used a pipe assembly consisting of an inner pipe for $SiCl_4$ and an outer pipe for $NH_3$ wherein the opening end of the inner pipe is placed inside the opening end of the outer pipe. In this case, however, both the starting material gases violently react with each other at a position just behind the opening end of the inner pipe to form intermediate compounds such as ammonium chloride, silicon diimide and the like, so that silicon nitride cannot be deposited efficiently and homogeneously on the substrate. A similar result is found to be obtained when the opening ends of the inner and outer pipes are arranged at the same level. Furthermore, the inventors have also found that a super hard silicon nitride cannot be obtained efficiently and homogeneously when the opening end of the inner pipe is arranged outside the opening end of the outer pipe.

Moreover, the inventors have found that the super hard-highly pure silicon nitrides can be produced efficiently and homogeneously when $NH_3$ and $SiCl_4$ are blown on a substrate by using a pipe assembly consisting of an inner pipe for $NH_3$ and an outer pipe for $SiCl_4$ and, if necessary, $H_2$ wherein the opening end of the inner pipe is arranged outside the opening end of the outer pipe, and passing $SiCl_4$ and $NH_3$ through the pipe assembly in such a manner that the flow rate of mixed gas of $SiCl_4$ and $H_2$ is larger than that of $NH_3$ while surrounding the stream of $NH_3$ with the stream of $SiCl_4$ and $H_2$.

The total gas pressure in a container accommodating the substrate is within a range of 1–760 mmHg, preferably 5–100 mmHg. Moreover, the silicon nitride according to the present invention can be produced even if the total gas pressure is more than 1 atm.

According to the present invention, a blowing director of the starting material to the substrate may be perpendicular or oblique or parallel to the surface of the substrate. Furthermore, by moving the substrate or the pipe assembly (blowpipe), silicon nitrides having various sizes of wire, plate or tubular form can be obtained.

Moreover, by applying an electrostatic potential difference between the substrate and the blowpipe, the silicon nitride according to the present invention can be deposited from the starting material in a high yield. In this case, the electrostatic potential difference may be applied between the substrate and the inner pipe or outer pipe of the blowpipe provided that the inner pipe and the outer pipe are electrically insulated with each other.

Further, according to the present invention, the silicon nitride can be deposited on the substrate by changing the pattern of the gas stream of the starting material in the vicinity of the substrate under an influence of an ultrasonic wave. In certain conditions, the silicon nitride can be deposited on the substrate in a high yield by preliminarily heating the starting material prior to the blowing so as to suppress the formation of intermediate compound.

The apparatus for carrying out the present invention will be described below.

According to the present invention, there is provided an apparatus for producing super hard-highly pure silicon nitrides, comprising a container capable of freely adjusting an atmosphere therein, a means for clamping and heating a substrate accommodated in said container and a blowpipe for blowing each of a nitrogen depositing source and a silicon depositing source on said substrate, said blowpipe being composed of a pipe assembly wherein a first pipe for said nitrogen depositing source is surrounded with a second pipe for said silicon depositing source and the distance from an opening end of said first pipe to said substrate is shorter than the distance from an opening end of said second pipe to said substrate.

As the container, use may be made of metallic and ceramic materials enduring to a vacuum degree of about $10^{-3}$ mmHg. Among them, a stainless steel container having a corrosion resistance against the starting material is preferably used.

Furthermore, the container is provided with an inlet port and/or exhaust port adapted to be opened and closed in order to adjust the atmosphere, if necessary, and to exhaust the waste gas formed during the reaction.

As the substrate, use may be made of materials resisting a temperature of 500°–1,900° C. required for depositing silicon nitrides and particularly, metallic materials and ceramic materials are advantageously used. The form of the substrate may be any of wire, plate, bar, cylinder and other complicated ones. Moreover, when the plate material is used as a substrate, the block-like silicon nitride can be obtained by depositing the silicon nitride on this substrate and then peeling off the deposited silicon nitride from the substrate.

The heating of the substrate may be effected by electric resistance heating, high-frequency heating, infrared-ray heating, sunlight heating, arc heating, laser heating, plasma heating and the like. Especially, when using an electrically conductive substrate, a direct heating in which the substrate is directly heated or an indirect heating in which the substrate is heated by means of an external heater may be adopted, but the direct heating by the electric resistance heating, high-frequency heating and the like is preferable because it can control the temperature of the substrate more precisely. When the substrate is electrically poor conductive, the indirect heating by the external heater is generally preferable.

Furthermore, a means for moving, vibrating or rotating the substrate may be connected to the clamping mechanism of the substrate so as to properly move, vibrate or rotate the substrate during the reaction. An ultrasonic wave generating means may also be arranged in order to adjust the stream form of the starting material gases and the flowing and mixing of these gases in the vicinity of the substrate. Alternatively, a special gas stirring means may be arranged for adjusting the stream pattern of the gases and the flowing and mixing thereof in the vicinity of the substrate.

The blowpipe constituting a main component of the apparatus according to the present invention will be described below.

The blowpipe is composed of a pipe assembly having various structures as shown in FIGS. 8A-8C. That is, the pipe assembly is a concentric double pipe in FIG. 8A, a triple pipe consisting of two inner pipes and one outer pipe in FIG. 8B and a concentric triple pipe in FIG. 8C. Besides them, the pipe assembly consisting of three or more inner pipes and one outer pipe may be used, if necessary.

If it is intended to enlarge a blowing area on the substrate, two or more of the above pipe assemblies may be used as the blowpipe.

In the blowpipe, it is an essential feature that the opening end of the inner pipe is more close to the substrate than the opening end of the outer pipe.

When the concentric triple pipe is used as the blowpipe, the opening end of the intermediate pipe may be located on a level with the opening end of either the inner pipe or the outer pipe or at a middle region between the opening ends of the inner and outer pipes.

Moreover, an air-tight seal capable of sliding, the blowpipe may be advantageously arranged at a portion where the blowpipe passes through the container wall to appropriately adjust a distance between the substrate and the blowpipe.

Although the opening end of each pipe of the pipe assembly can be slidably changed, it is necessary that the distance between the opening end of the inner pipe and the substrate is shorter than the distance between the opening end of the outer pipe and the substrate in practice.

As the blowpipe, it is desirable to use materials enduring to an elevated temperature and having a resistance to corrosion against the starting material gas used, and particularly a water-coolable double-cylindrical pipe of stainless steel is advantageously used.

With the use of the blowpipe, the nitrogen depositing source gas is blown from the inner pipe and the silicon depositing source gas is blown from the outer pipe as previously mentioned above. Moreover, when the concentric triple pipe shown in FIG. 8C is used as the blowpipe, at least one of $H_2$, He, $N_2$ and Ar gases is blown from the intermediate pipe, whereby the mixing of both the depositing source gases can be prevented before the arrival at the substrate, so that both the gases are first reacted on or near the substrate.

In the apparatus according to the present invention shown in FIG. 9, a substrate 2 is accommodated in a container 1 and its both ends are fixed by means of water-cooled and electrically conductive clamping rods 3. A blowpipe 4 is mounted on the container so that the opening end thereof is directed to the surface of the substrate. The container 1 is constructed with a water-cooled double wall and provided with one or more exhaust ports 8. Furthermore, the container 1 is provided with an adaptor 5 for a vacuum gauge and a door 6 for taking in and out a substrate, a part of which being constituted with a transparent quartz glass to observe circumstances in the container.

At first, the substrate 2 is placed in the container 1 through the door 6 and clamped at its both ends between the clamping rods 3. After air in the container 1 is exhausted to a vacuum degree of $10^{-3}$ mmHg, the substrate 2 is heated to 500°–1,300° C. by supplying an electric current to the clamping rods 3, whereby gases included in the substrate are removed.

Then, gases of a nitrogen depositing source and a silicon depositing source and if necessary, a carrier gas are blown onto the substrate 2 through the blowpipe 4 while heating and maintaining the substrate at a temperature of 500°–1,900° C., preferably 1,000°–1,600° C. in such a manner that the nitrogen depositing source gas passes through the inner pipe and the silicon depositing source gas and the carrier gas pass through the outer pipe. In this way, both the depositing source gases are contacted and mixed with each other on or near the substrate to effect chemical vapor deposition reaction, whereby the objective silicon nitride is deposited on the substrate. In this case, the thickness of the deposited silicon nitride may be made thick by prolonging the blowing time (deposition time), or the silicon nitride with a wide deposition area may be obtained by moving the substrate or the blowpipe as previously mentioned above.

Figure 10:
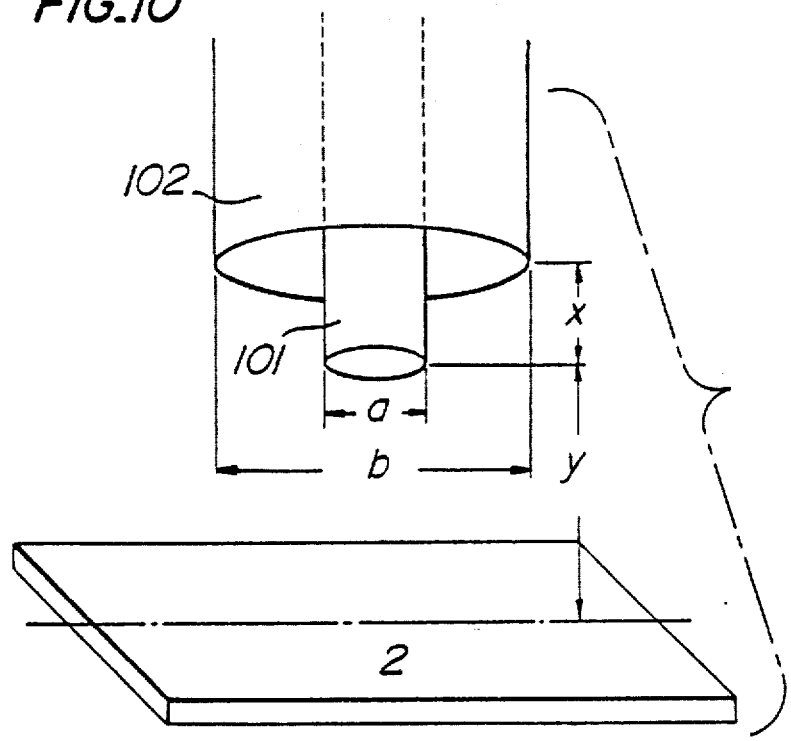
FIG. 10 is a perspective view of the blowpipe used for carrying out the invention.

Then, when the blowpipe shown in FIG. 10 is used to efficiently obtain a homogeneous and super hard silicon nitride, a relation of various parameters in this blowpipe will be described. In FIG. 10, symbol a represents a diameter of the inner pipe 101, symbol b a diameter of the outer pipe 102, symbol y a distance between the opening end of the inner pipe 101 and the substrate 2, and symbol x a level difference between the opening ends of the inner and outer pipes 101 and 102, respectively.

When using the container having a diameter of 300 mm and a length of 500 mm and the substrate having a plate form of $2 \times 12 \times 400$ mm, it is preferable that a is 0.1–4 cm, b is 0.3–10 cm, x is 0.3–14 cm and y is 1–14 cm. Moreover, when $SiCl_4$ and $NH_3$ are used as a silicon depositing source and a nitrogen depositing source, respectively, if the flow amount of $SiCl_4$ (liquid state) is 0.8 cc/min. the flow amount of $NH_3$ is 60 cc/min, the flow amount of $H_4$ is 700 cc/min, the gas pressure in the container is 1–300 mmHg, and the temperature of the substrate is 1,100–1,500° C., a, b, x and y are preferably 0.8 cm, 2 cm, 2 cm and 3 cm, respectively.

Figure 11:
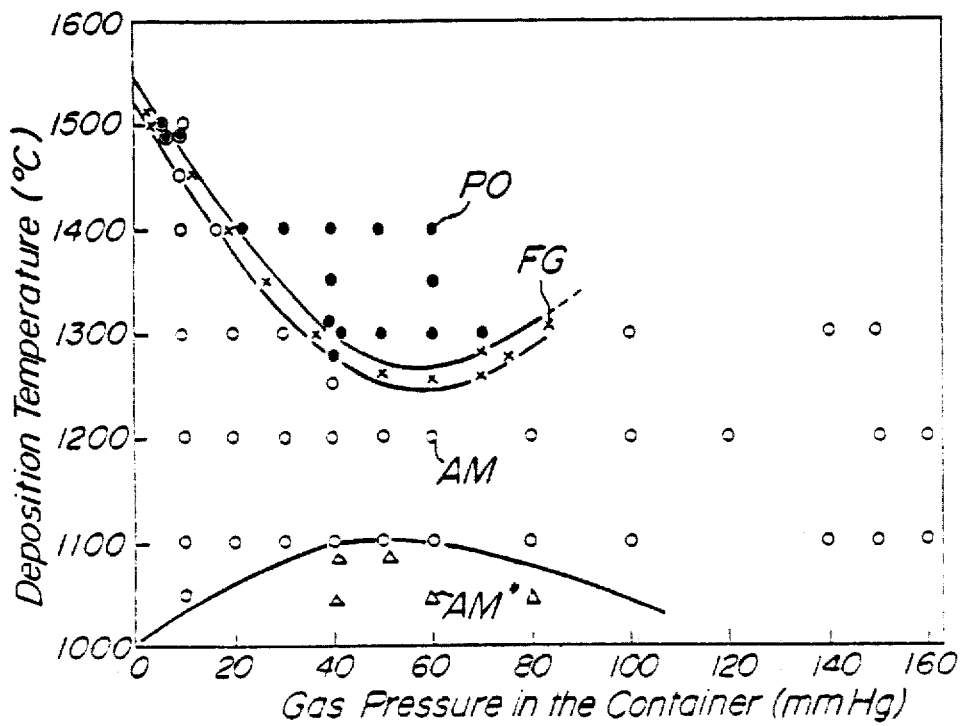
FIG. 11 is a graph showing the effects of the temperature and the gas pressure to the container during the deposition on the crystal forms of the silicon nitrides according to the invention.

Under such conditions that the flow amount of SiCl$_4$ (liquid state) is 0.8 cc/min, the flow amount of NH$_3$ is 60 cc/min, the flow amount of H$_2$ is 700 cc/min, a is 1 cm, b is 2 cm, x is 2 cm and y is 3 cm any one of the preferentially oriented crystalline, finely grained crystalline and amorphous silicon nitrides can be deposited depending upon the deposition temperature and gas pressure in the container as shown in FIG. 11. In this figure, a region PO represents the production of the preferentially oriented crystalline silicon nitride, a region FG the production of the finely grained crystalline silicon nitride and a region AM the production of the amorphous silicon nitride. Moreover, amorphous silicon nitride can be deposited under a condition of a region AM" shown in FIG. 11, but its hardness is an MVH of about 2,000 kg/mm$^2$ or less under a load of 100 g.

As mentioned above, the finely grained and preferentially oriented crystalline silicon nitrides have a higher hardness next to those of diamond and curbic boron nitride. Also, both the silicon nitrides have a hardness higher than that of the typical super hard material B.C. Furthermore, the amorphous silicon nitride has a hardness higher than those of TiC, SiC, WC, Al$_2$O$_3$ and the like, which are usually called super hard materials.

Generally, artificial diamond and cubic boron nitride are synthesized by heating at an elevated temperature of 1,500°–2,000° C. under a super high pressure of 50,000–100,000 atm, so that they are particles of less than 0.5 mm and hence they cannot be obtained in the block form and cannot be used for coating material. On the contrary, the present invention makes it possible to produce silicon nitrides in the form of not only block but also thin film, so that the resulting silicon nitrides are used as a super hard material for fairly wide applications as compared with the diamond and cubic boron nitride and also the production cost is considerably low.

Furthermore, the crystalline silicon nitrides have a hardness higher than those of other actual materials even at a temperature of 1,500° C. as shown in FIG. 6, so that they are useful as ultra-high temperature materials. Moreover, the amorphous silicon nitride having a super high hardness is a translucent or transparent body, so that it can be used for sight windows and the like exposed to elevated temperature.

The silicon nitrides according to the present invention will be expected to be utilized for the following applications due to the super high hardness and excellent high-temperature properties.

1. As a coating material:

(a) The life of tooling materials such as a cutting tool, die, drill, cutter and the like can be prolonged by applying on the surface of the tooling material so that the maintenance of automatic working system becomes more easy.

(b) The wearing and high-temperature baking of machine parts requiring a wear resistance, such as a bearing, toothed wheel, rotating shaft and the like are prevented by applying on the surface of the machine part.

(c) By applying on the surface of various materials such as a metal, compound, ceramics, graphite and the like, the hardness is increased and mechanical properties at elevated temperature are improved (For example, engine parts, turbine parts and the like).

(d) The electrical insulation properties are given to the surface of various materials (For example, high-temperature insulator and the like).

(e) The oxidation resistance and corrosion resistance against high-temperature corrosive gas, molten metal, chemicals or the like are improved (For example, crucible, boat, chemical plant parts, duct for MHD generator, nozzle for rocket and the like).

2. As a block material:

(a) Tooling materials requiring a higher hardness, for example, a super hard cutting tool, super hard die and the like.

(b) Hard laboratory instruments requiring a higher hardness, for example, an indenter of a hardness tester and the like.

(c) Machine parts requiring a higher hardness at an elevated temperature, for example, a bearing, rotating shaft, sealing materials and the like.

(d) High-temperature structural materials, for example, engine parts, turbine parts and the like.

The following examples are given in illustration of this invention and are not intended as limitations thereof.

EXAMPLE 1

The production of the silicon nitride was effected by using the apparatus shown in FIG. 9. A plated substrate 2 of artificial graphite was placed in a container 1 and clamped between copper electrodes 3 and thereafter air in the container was exhausted to a vacuum degree of 10$^{-3}$ mmHg. Then, the substrate was heated above 500° C. by supplying an electric current to the electrodes so as to remove gases from the substrate and further heated and maintained at 1,100° C. Onto the heated substrate were blown gases of starting materials through a blowpipe 4 in such a manner that ammonia gas was passed at a flow rate of 60 cc/min through an inner pipe, while hydrogen gas was passed at a flow rate of 700 cc/min together with silicon tetrachloride (vapor pressure: 180 mmHg) through an outer pipe. In this case, a gas pressure in the container was 20 mmHg.

After the gases were blown for 15 hours, the supply of electric current was stopped and the substrate after cooled was taken out from the container. Thus, a plate-like and white translucent amorphous silicon nitride having a thickness of 1.5 mm was deposited on the surface of the substrate. In this case, the deposition rate was 0.1 mm/hr.

The properties of this silicon nitride were as follows:

| | |
|---|---|
| Crystal structure: | amorphous |
| Amorphous degree: | considerably broad halo at low angle |
| Amorphous primary cone size: | 20 μm |
| Density: | 2.80 g/cm$^3$ |
| Si/N ratio: | 0.73 |
| MVH: | 2,800 kg/mm$^2$ (load = 100 g) |

EXAMPLE 2

The amorphous silicon nitride was produced by repeating the same procedure as described in Example 1, except that the temperature of the substrate was 1,200° C., the flow rate of hydrogen gas was 1,000 cc/min and the blowing time was 4 hours. Thus, a white amorphous silicon nitride having a thickness of 2 mm was deposited on the surface of the substrate. In this case, the deposition rate was 0.5 mm/hr.

The properties of this silicon nitride were as follows:

| Crystal structure: | amorphous |
|---|---|
| Amorphous degree: | two halos at angles of 20-40° and 60-70° |
| Amorphous secondary cone size: | 15 μm |
| Density: | 2.77 g/cm$^3$ |
| Si/N ratio: | 0.74 |
| MVH: | 3,100 kg/mm$^2$ (load = 100 g) |
| Initial oxidation rate at 1,300° C.: | 0.2 mg/cm$^2$/hr, no oxidation increment after 1.5 hours |
| Compression strength: | about 30 kg/mm$^2$ |

EXAMPLE 3

The preferentially oriented crystalline silicon nitride was produced by repeating the same procedures as described in Example 1, except that the temperature of the substrate was 1,400° C., the gas pressure in the container was 40 mmHg and the blowing time was 5 hours. Thus, a light brown and preferentially oriented crystalline silicon nitride having a thickness of 5 mm was deposited on the surface of the substrate. In this case, the deposition rate was 1 mm/hr.

The properties of this silicon nitride were as follows:

| Crystal structure: | α-type hexagonal |
|---|---|
| Crystal orientation: | crystal faces (110), (210) and (222) |
| Grain size: | less than μm |
| Density: | 3.184 g/cm$^3$ |
| Si/N ratio: | 0.74 |
| MVH: | 3,900-4,000 kg/mm$^2$ (load = 100 g) |
| Oxidation resistance: | good at 1,400° C. |
| Compression strength: | 180 kg/mm$^2$ |
| Corrosion resistance against molten Fe, Al Na or K: | good |

EXAMPLE 4

The finely grained crystalline silicon nitride was produced by repeating the same procedure as described in Example 1, except that the temperature of the substrate was 1,500° C., the gas pressure in the container was 10 mmHg and the blowing time was 4 hours. Thus, a greyish white and finely grained crystalline silicon nitride having a thickness of 2.4 mm was deposited on the surface of the substrate. In this case, the deposition rate was 0.6 mm/hr.

The properties of this silicon nitride were as follows:

| Crystal structure: | α-type hexagonal |
|---|---|
| Crystal orientation: | crystal faces (110) and (210) |
| Grain size: | less than 10 μm |
| Density: | 3.184 g/cm$^3$ |
| Si/N ratio: | 0.73 |
| MVH: | 4,500-5,000 kg/mm$^2$ (load = 100 g) |
| Oxidation resistance: | good at 1,500° C. |
| Compression strength: | 200 kg/mm$^2$ |

EXAMPLE 5

A cylindrical artificial graphite as a substrate was coated with the preferentially oriented crystalline silicon nitride by repeating the same procedure as described in Example 1, except that the temperature of the substrate was 1,300° C., the flow rate of ammonia gas was 100 cc/min, the flow rate of hydrogen gas was 1,500 cc/min, the vapor pressure of silicon tetrachloride was 320 mmHg, the gas pressure in the container was 50 mmHg and the blowing time was 30 minutes. Thus, a very dense and brown preferentially oriented crystalline silicon nitride coating having a thickness of 0.35 mm was deposited on the substrate. In this case, the deposition rate was 0.7 mm/hr.

The properties of this coating were as follows:

| Crystal structure: | α-type hexagonal |
|---|---|
| Crystal orientation: | crystal faces (110), (210) and (101) |
| Grain size: | less than 40 μm |
| Density: | 3.184 g/cm$^3$ |
| Si/N ratio: | 0.74 |
| MVH: | 3,300-3,800 kg/mm$^2$ (load = 100 g) |

This silicon nitride coating was very excellent in the adhesiveness to the graphite and resistance to a quenching treatment from 1,600° C. and did not change even in an oxidizing atmosphere at 1,500° C.

EXAMPLE 6

The finely grained crystalline silicon nitride was deposited on a super hard cutting tool consisting mainly of tungsten carbide as a substrate by repeating the same procedure as described in Example 1, except that the artificial graphite shaped in crucible form was used as an electrode, the temperature of the substrate was 1,300° C., the flow rate of ammonia gas was 30 cc/min, the flow rate of hydrogen gas was 1,100 cc/min, the vapor pressure of silicon tetrachloride was 120 mmHg, the gas pressure in the container was 40 mmHg and the blowing time was 15 minutes. Thus, a blackish brown finely grained crystalline silicon nitride coating having a thickness of 0.05 mm was deposited on the surface of the substrate. In this case, the deposition rate was 0.2 mm/hr.

The properties of this coating were as follows:

| Crystal structure: | α-type hexagonal |
|---|---|
| Crystal orientation: | crystal faces (110), (210) and (222) |
| Grain size: | 0.8 μm in average |
| Density: | 3.184 g/cm$^3$ |
| Si/N ratio: | 0.735 |
| MVH: | 4,300 kg/mm$^2$ (load = 100 g) |

This silicon nitride coating was good in the adhesiveness to the super hard cutting tool and did not change even in an oxidizing atmosphere at 1,500° C.

EXAMPLE 7

The preferentially oriented crystalline silicon nitride was deposited on a commercially available silicon nitride sintered body as a substrate by repeating the same procedure as described in Example 6, except that the flow rate of ammonia gas was 60 cc/min, the flow rate of hydrogen gas was 700 cc/min, the vapor pressure of silicon tetrachloride was 180 mmHg, the gas pressure in the container was 50 mmHg and the blowing time was 10 minutes.

The properties of the thus obtained silicon nitride coating were as follows:

| Crystal structure: | α-type hexagonal |
|---|---|
| Crystal orientation: | crystal faces (110), (210) |

|   |   |
|---|---|
|   | and (222) |
| Grain size: | less than 40 μm |
| Density: | 3.184 g/cm³ |
| Si/N ratio: | 0.74 |
| MVH: | 3,750 kg/mm² (load = 100 g) |

This silicon nitride coating was very excellent in the adhesiveness to the silicon nitride sintered body and was not peeled off even by quenching from 1,500° C.

EXAMPLE 8

A tube of the preferentially oriented crystalline silicon nitride was manufactured by repeating the same procedure as described in Example 5, except that the flow rate of ammonia gas was 60 cc/min, the flow rate of hydrogen gas was 700 cc/min, the vapor pressure of silicon tetrachloride was 200 mmHg, the gas pressure in the container was 45 mmHg, and the blowing time was 8 hours. Thus, a cream colored preferentially oriented crystalline silicon nitride coating having a thickness of about 4 mm was deposited on the crylindrical graphite substrate. This assembly was immersed in a mixed solution of $HNO_3$ and $H_2SO_4$ to remove the substrate, whereby the tubular silicon nitride was obtained. The MVH of this tubular silicon nitride was 3,500–3,800 kg/mm² (load = 100 g).

EXAMPLE 9

The preferentially oriented crystalline silicon nitride was produced by repeating the same procedure as described in Example 1, except that the temperature of the substrate was 1,400° C., the gas pressure in the container was 60 mmHg and the blowing time was 3 hours. Thus, a light brown and preferentially oriented crystalline silicon nitride having a thickness of 3.6 mm was deposited on the surface of the substrate. In this case, the deposition rate was 1.2 mm/hr.

The properties of this silicon nitride were as follows:

|   |   |
|---|---|
| Crystal structure: | α-type hexagonal |
| Crystal orientation: | mainly crystal face (222) |
| Grain size: | less than 20 μm |
| Density: | 3.184 g/cm³ |
| Si/N ratio: | 0.74 |
| MVH: | 3,500–4,000 kg/mm² (load = 100 g) |

What is claimed is:

1. The super hard, highly pure silicon nitride having a crystal orientation wherein the crystal face (h 0 l) in a hexagonal system is oriented in parallel to the substrate upon which the silicon nitride was deposited, a grain size of not more than 50 μm and a micro Vickers hardness of more than 3,000 Kg/mm² under a load of 100 g.

2. The super hard, highly pure silicon nitride of claim 1, wherein said silicon nitride has a primary cone composed of fine grains having an average grain size of less than 1 μm.

3. The super hard, highly pure silicon nitride of claim 1, in the form of a layer on said substrate.

4. The super hard, highly pure silicon nitride of claim 1, in bulk solid form wherein the silicon nitride deposited has been separated from said substrate.

* * * * *